United States Patent [19]

Malhi

[11] Patent Number: 5,554,546
[45] Date of Patent: Sep. 10, 1996

[54] METHOD OF FABRICATING A HIGH VOLTAGE TRANSISTOR

[75] Inventor: Satwinder Malhi, Garland, Tex.

[73] Assignee: Texas Instruments Inc., Dallas, Tex.

[21] Appl. No.: 513,056

[22] Filed: Oct. 17, 1995

Related U.S. Application Data

[62] Division of Ser. No. 342,398, Nov. 18, 1994, which is a continuation of Ser. No. 317, Jan. 4, 1993, abandoned.

[51] Int. Cl.$^6$ .............................................. H01L 21/8234
[52] U.S. Cl. ............................... 437/40; 437/24; 437/913; 148/DIG. 126
[58] Field of Search ................................ 437/40 R, 41 R, 437/40 DM, 41 DM, 40 AS, 41 AS, 24, 26, 29, 913; 148/DIG. 126

[56] References Cited

U.S. PATENT DOCUMENTS

| | | | |
|---|---|---|---|
| 4,523,213 | 6/1985 | Konaka et al. | 437/24 |
| 4,866,495 | 9/1989 | Kinzer | 257/337 |
| 5,113,236 | 5/1992 | Arnold et al. | 257/347 |
| 5,182,226 | 1/1993 | Jang | 437/26 |
| 5,346,835 | 9/1994 | Malhi et al. | 437/41 DM |

Primary Examiner—Charles L. Bowers, Jr.
Assistant Examiner—Michael Trinh
Attorney, Agent, or Firm—William B. Kempler; Richard L. Donaldson

[57] ABSTRACT

A high voltage transistor includes a semiconductor-on-insulator (SOI) region in which a source and a channel are formed. A drain drift region is further formed partly in the SOI region and partly in the bulk silicon region beyond SOI and a gate is coupled to said SOI channel.

9 Claims, 2 Drawing Sheets

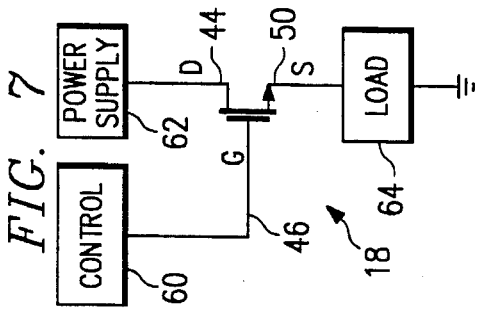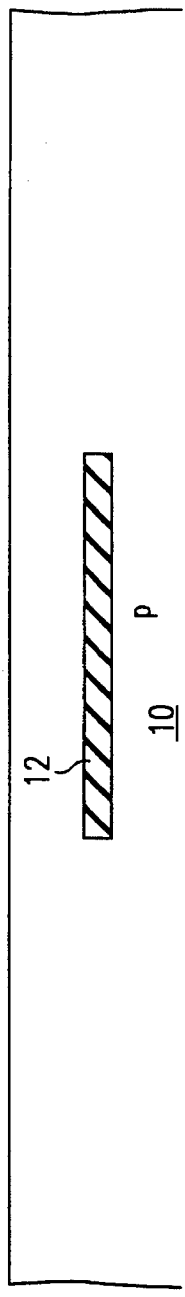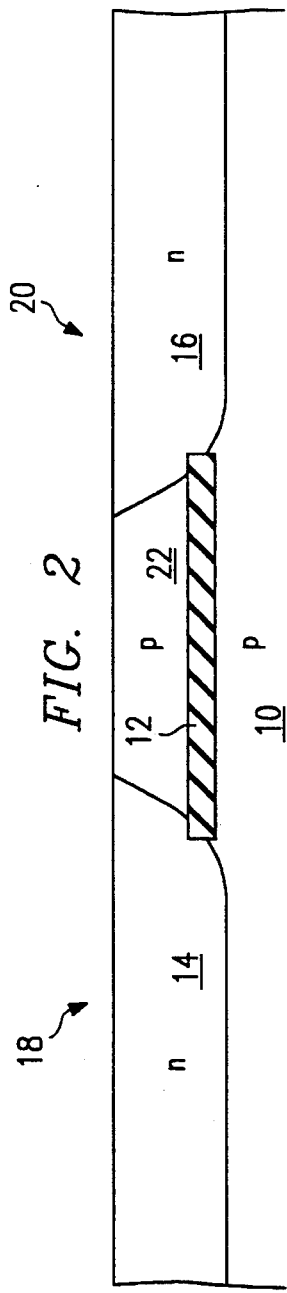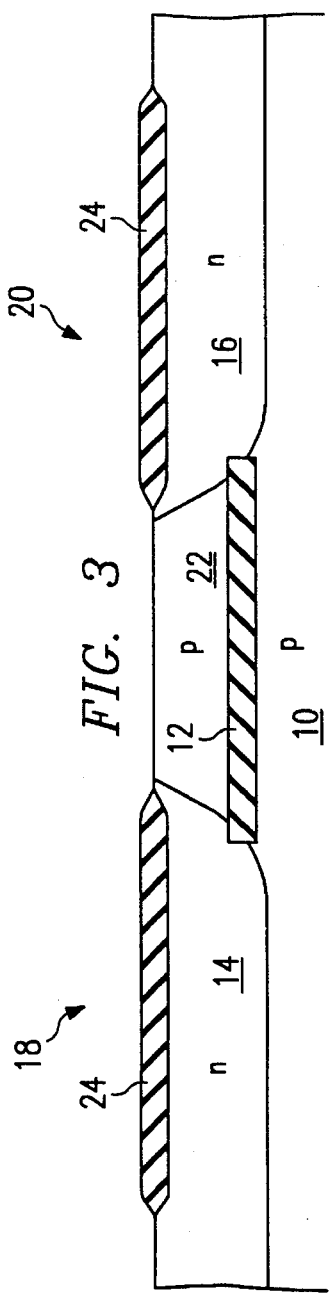

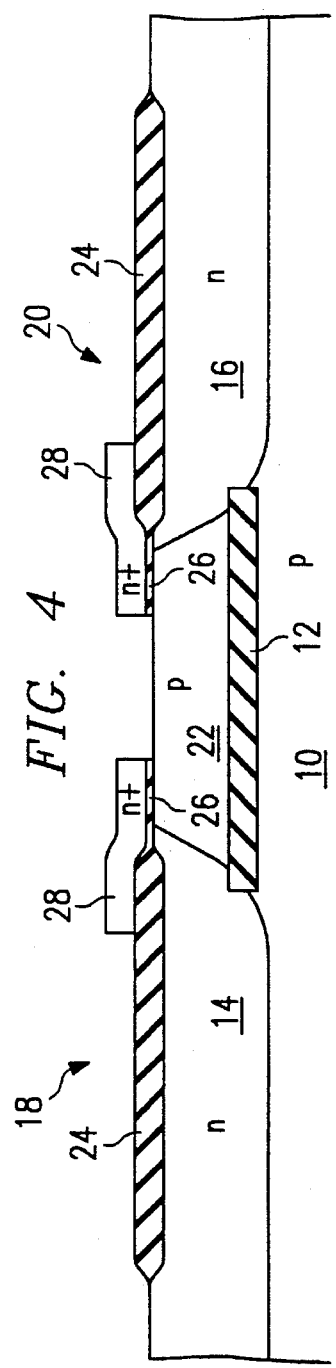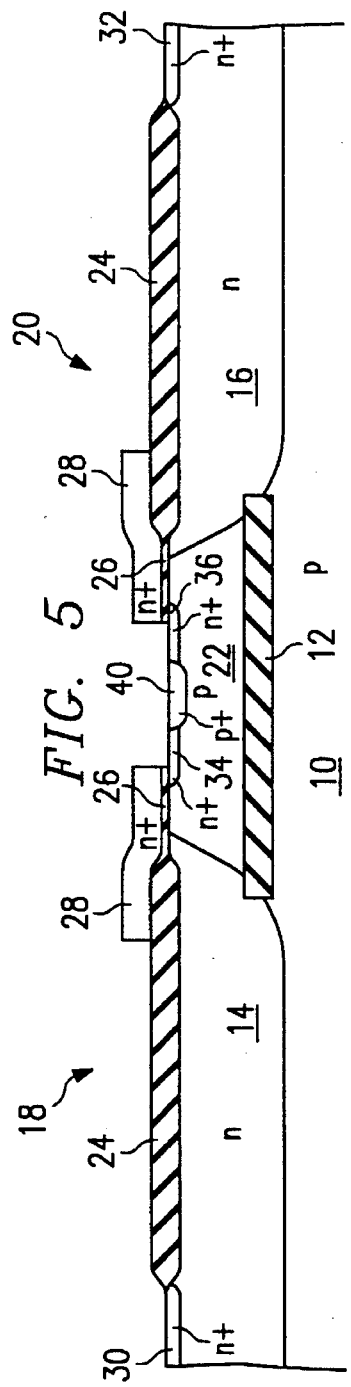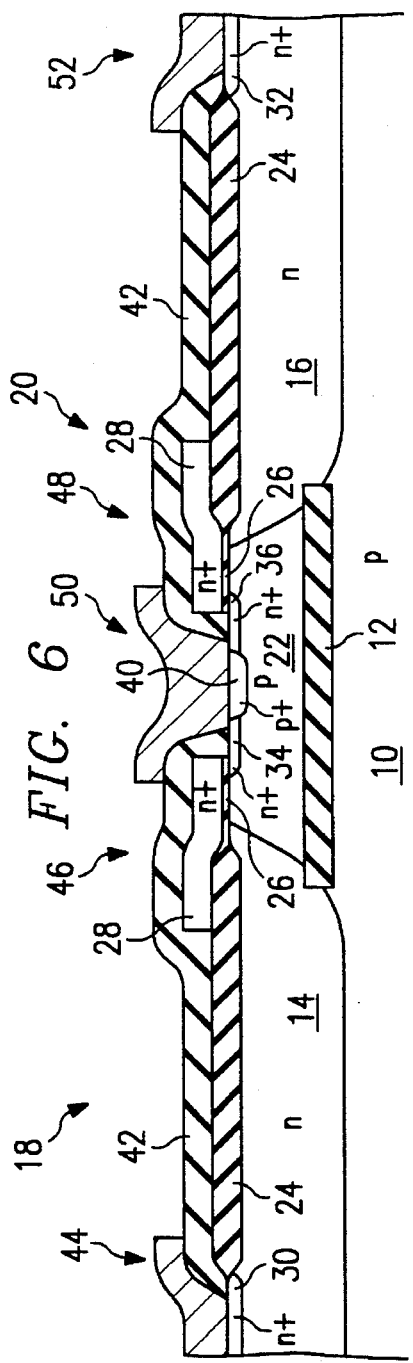

METHOD OF FABRICATING A HIGH VOLTAGE TRANSISTOR

This is a division of application Ser. No. 08/342,398, filed Nov. 18, 1994, which is a continuation of application Ser. No. 08/000,317, filed Jan 4, 1993, now abandoned.

TECHNICAL FIELD OF THE INVENTION

This invention relates in general to the field of semiconductor integrated circuits, and more particularly the present invention relates to high voltage devices.

BACKGROUND OF THE INVENTION

There has been much recent progress in the field of power transistors, such as LDMOS (lateral double diffused MOS) power transistors with low "on-resistance" ($Rds_{ON}$), and RESURF (reduced surface field) devices. Please refer to Appels, J. A. and Vaes, H. M. J., "High Voltage Thin Layer Devices (RESURF Devices)," *IEDM Tech Digest*, pp. 238–241, 1979, for a more detailed description of the RESURF technology.

Power devices are typically used in two circuit configurations, as a low side driver or a high side driver. In a low side driver circuit configuration, the drain of the power device is coupled to the power supply through a lead circuit, and its source is coupled to ground. In a high side driver circuit configuration, the drain is coupled directly to a power supply, and the source is coupled to ground through a lead circuit. RESURF LDMOS transistors are commonly used in the low side driver configuration because the source is structurally coupled to the substrate which in turn is coupled to ground. Therefore, these power devices are not used in high side driver applications and other applications where electrical isolation between the source and substrate is desirable.

Accordingly, it is desirable to provide a high voltage device with electrical isolation between source and substrate to be used as a high side driver. Additionally, it is necessary that such high power device exhibit low on-resistance ($Rds_{ON}$) characteristics.

SUMMARY OF THE INVENTION

In accordance with the present invention, a high voltage high-side driver RESURF LDMOS is provided which eliminates problems associated with prior RESURF LDMOS power transistors.

In one aspect of the present invention, a high voltage transistor includes a semiconductor-on-insulator (SOI) region in which a source and a channel are formed. A bulk semiconductor drain drift region is further formed beyond the SOI region and a gate is coupled to said SOI channel.

In another aspect of the present invention, a method for fabricating a high voltage transistor includes forming a localized SOI region in a semiconductor substrate, and forming a source region in the SOI region. A drain and a drain drift region is further formed in the substrate generally outside of the SOI region. A gate is then formed above the SOI channel and between the source region and the drain drift region.

An important technical advantage of the present invention is that due to its isolated source, the device can be used in high side driver circuit configuration. Furthermore, constructed in a manner consistent with the teachings of the invention, the planar structure of the high voltage transistor may be fabricated with fewer steps and with existing fabrication processes. Since the drain drift region is built primarily in the bulk, width limitations of Epitaxial Lateral Overgrowth (ELO) SOI material does not limit the design of high voltage device with long drift region.

BRIEF DESCRIPTION OF THE DRAWINGS

For a better understanding of the present invention, reference may be made to the accompanying drawings, in which:

FIG. 1 is a cross-sectional view of a wafer in a first step of fabrication;

FIG. 2 is a cross-sectional view of a wafer in a subsequent step of fabrication;

FIG. 3 is a cross-sectional view of a wafer in a subsequent step of fabrication;

FIG. 4 is a cross-sectional view of a wafer in a subsequent step of fabrication;

FIG. 5 is a cross-sectional view of a wafer in a subsequent step of fabrication;

FIG. 6 is a cross-sectional view of a preferred embodiment of the invention; and FIG. 7 is a block diagram of a high side driver circuit configuration.

DETAILED DESCRIPTION OF THE INVENTION

The preferred embodiment of the present invention and its advantages are best understood by referring to FIGS. 1–7 of the drawings, like numerals being used for like and corresponding parts of the various drawing figures. The views shown in the drawing figures are not to scale, and certain dimensions may have been greatly exaggerated or diminished for clarity. With reference to the drawings, FIG. 1 illustrates a wafer 10 having a p-type substrate and a buried oxide layer 12. Buried oxide layer 12 may be formed with silicon or semiconductor-on-insulator (SOI) techniques, such as Epitaxial Lateral Overgrowth (ELO) SOI, vertical DELTA SOI (fully depleted lean channel transistor) technology (Hisamoto, Digh et al., *Impact of the Vertical SOI "DELTA" Structure on Planar Device Technology*, IEEE Transactions on Electron Devices, Vol. 38, No. 6, June 1991, pp. 1419–1424), wafer bonding, SIMOX (separation by implanted oxygen), and other implantation techniques. Preferably, buried oxide layer 12 is positioned approximately 2–3 μm below the surface of the wafer 10 and is approximately 1 μm thick and 8 μm wide. In the embodiment shown in FIGS. 1–6, a double device back-to-back configuration is shown, but single device configurations may also be implemented in a similar manner according to the invention.

Referring to FIG. 2, n-type drain drift regions 14 and 16 are formed in the p-type bulk or substrate near the ends of buried oxide layer 12 for devices 18 and 20. Preferably, the drift regions 14 and 16 extend 4–5 μm below the wafer surface generally to a depth deeper than the buried oxide layer 12. Regions 14 and 16 may be formed by implanting phosphorous ions at a dose of $3 \times 10^{12}/cm^2$ at 100 KeV. Constructed in this manner, drain drift regions 14 and 16 frame therebetween a p-type single crystalline semiconductor channel in the SOI region 22.

In FIG. 3, a LOCOS field oxide layer 24 is formed above the n-type drift regions 14 and 16 as shown. Field oxide 24 is approximately 1 μm thick. Referring to FIG. 4, pattern etched gate oxide layer 26 and n+ doped polysilicon layer 28 are formed. Preferably gate oxide layer 26 is approximately 500 Å thick and gate polysilicon layer 28 is 0.5 µm thick.

Referring to FIG. 5, n+ drain regions 30 and 32 are formed by implantation above drain drift regions 14 and 16, respectively. N+ source regions 34 and 36 are formed in p-type SOI region 22, preferably, by implanting arsenic ions having an approximate dosage of $5 \times 10^{15}/cm^2$ at 100 KeV. An implant of boron ions at about $2 \times 10^{15}/cm^2$ and 30 Kev, for example, forms a p+ region 40 between n+ regions 34 and 36, which makes contact to the body region 22 of devices 18 and 20.

Referring to FIG. 6, a patterned oxide layer 42 is formed, by deposition, etching and reflow, for example, over the devices 18 and 20 but exposing the drain 44, gate 46 and 48 and source/body 50 regions. Metal contacts are subsequently formed at regions 44–50. Note that drain 44, gate 46 and source 50 form the terminals of device 18, and source 50, gate 48 and drain 52 form the terminals of device 20.

Referring to FIG. 7, high voltage device 18 is shown connected in a high side driver circuit configuration. The gate 46 is coupled to a control circuitry 60, which may include a microprocessor or a distributed processor network. The drain is coupled to a power supply 62. The source of device 18 is coupled to one or more loads 64, which is further connected to ground. Referring also to FIG. 6, the channel 22 and source 34, 36 are built in the SOI region and are thus isolated by the buried oxide layer 12 from the grounded substrate, so that the source 50 can float with the potential of the load circuit. The drift region is primarily built in the bulk region so that SOI width limitations do not adversely affect the length of the drift region which is determined by the required breakdown voltage. Constructed in this manner, RESURF optimization methods may be advantageously utilized.

It is important to note that the fabrication of the invention is not limited to the process parameters described above. Dimensions, impurity ion concentrations, implant energies, and processes may vary in accordance with the teachings of the invention. Although the present invention has been described in detail, it should be understood that various changes, substitutions and alterations can be made thereto without departing from the spirit and scope of the present invention as defined by the appended claims.

What is claimed is:

1. A method for fabricating a semiconductor device comprising the steps of:

providing a substrate having a first conductivity type;

forming a body insulating layer in said substrate beneath a face of said substrate and spaced from said face;

forming a first doped region of a second conductivity type, said first doped region extending from said face into said substrate to a depth equal to or greater than said insulating layer and surrounding said body insulating layer, thereby isolating a channel region of said substrate between said face, said body insulating layer and said first doped region;

forming a first contact providing conductive contact to said first doped region;

forming a second doped region in said channel region, said second doped region having said second conductivity type and said second doped region being spaced from said first doped region;

forming a second contact providing conductive contact to said second doped region;

forming a gate insulating layer on said face over the portion of said channel region between said first and second doped regions; and forming a gate on said gate insulating layer.

2. A method for forming a semiconductor device as in claim 1 wherein said first contact also provides conductive contact to said channel region.

3. A method for forming a semiconductor device as in claim 2 further comprising:

forming a channel contact doped region in said channel region, said channel contact doped region having said first conductivity type and a higher dopant concentration than said channel region.

4. A method for forming a semiconductor device as in claim 1 wherein said body insulating layer comprises silicon dioxide.

5. A method for forming a semiconductor device as in claim 1 wherein said body insulating layer is 2 to 3µ beneath said face.

6. A method for forming a semiconductor device as in claim 1 wherein the steps for forming said second contact comprise;

forming a third doped region of said second conductivity type in said first doped region and having a higher dopant concentration than said first doped region; and forming a conductor on said face in contact with said third doped region.

7. A method for forming a semiconductor device as in claim 1 wherein said first conductivity type is P and said second conductivity type is N.

8. A method for forming a semiconductor device as in claim 1 wherein said substrate is connected to a reference potential.

9. A method for forming a semiconductor device comprising:

providing a crystalline silicon substrate having a conductivity type of P;

forming a body insulating layer of silicon dioxide in said substrate beneath a face of said substrate and spaced from said face;

forming a first doped region of a conductivity type of N, said first doped region extending from said face into said substrate to a depth equal to or greater than said insulating layer and surrounding said body insulating layer, thereby isolating a channel region of said substrate between said face, said body insulating layer and said first doped region;

forming a first contact providing conductive contact to said first doped region;

forming a second doped region in said channel region, said second doped region having a conductivity type of N and said second doped region being spaced from said first doped region;

forming a second contact providing conductive contact to said second doped region;

forming a gate insulating layer of silicon dioxide on said face over the portion of said channel region between said first and second doped regions; and forming a gate of doped polycrystalline silicon on said gate insulating layer.

\* \* \* \* \*